(12) United States Patent
Ishii et al.

(10) Patent No.: US 11,510,325 B2
(45) Date of Patent: Nov. 22, 2022

(54) OPTICAL TRANSCEIVER

(71) Applicant: Sumitomo Electric Industries, Ltd., Osaka (JP)

(72) Inventors: Kuniyuki Ishii, Osaka (JP); Hiromi Kurashima, Osaka (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 222 days.

(21) Appl. No.: 17/116,207

(22) Filed: Dec. 9, 2020

(65) Prior Publication Data

US 2021/0176874 A1 Jun. 10, 2021

(30) Foreign Application Priority Data

Dec. 10, 2019 (JP) .............................. JP2019-223052

(51) Int. Cl.
*H05K 5/00* (2006.01)
*H04B 10/40* (2013.01)
*H05K 7/20* (2006.01)
*H05K 1/02* (2006.01)

(52) U.S. Cl.
CPC .......... *H05K 5/0026* (2013.01); *H04B 10/40* (2013.01); *H05K 1/0201* (2013.01); *H05K 5/0047* (2013.01); *H05K 7/2039* (2013.01)

(58) Field of Classification Search
CPC .................................................. H05K 5/0047
See application file for complete search history.

(56) References Cited

U.S. PATENT DOCUMENTS

| | | | | |
|---|---|---|---|---|
| 10,834,833 | B1* | 11/2020 | Yoder | H05K 5/0069 |
| 2015/0208525 | A1* | 7/2015 | Negishi | B60R 16/0239 |
| | | | | 361/752 |
| 2016/0295729 | A1* | 10/2016 | Hanada | H05K 5/0052 |
| 2017/0256929 | A1* | 9/2017 | Kobayashi | H02G 3/081 |
| 2018/0014418 | A1* | 1/2018 | Kang | H05K 5/0047 |
| 2018/0042128 | A1* | 2/2018 | Su | H05K 5/0217 |
| 2019/0208658 | A1* | 7/2019 | Ikeda | H01R 13/5213 |
| 2020/0323088 | A1* | 10/2020 | Atsumi | H05K 5/0017 |
| 2021/0185795 | A1* | 6/2021 | Toyama | H01L 23/00 |
| 2021/0273371 | A1* | 9/2021 | Sumida | H01R 13/6272 |

FOREIGN PATENT DOCUMENTS

| | | |
|---|---|---|
| JP | 2011-215620 A | 10/2011 |
| JP | 2014-119712 A | 6/2014 |

* cited by examiner

*Primary Examiner* — Hung V Ngo
(74) *Attorney, Agent, or Firm* — Baker Botts L.L.P.; Michael A. Sartori

(57) ABSTRACT

An optical transceiver includes a circuit board having a first side and a first edge; a thermal conductive member configured to be attached on the first side of the circuit board; the thermal conductive member having a first thermal conductive face inclined with respect to the first side of the circuit board and parallel to the first direction; a filling material having a thermal conductivity; and a housing having an inner face and an inner space, the housing being configured to house the circuit board, the circuit component, the thermal conductive member, and the filling material, and configured to hold the electrical connector at an end thereof in the first direction, the housing having a second thermal conductive face facing the first thermal conductive face with a spacing. The filling material adheres to the first thermal conductive face and the second thermal conductive face.

5 Claims, 16 Drawing Sheets

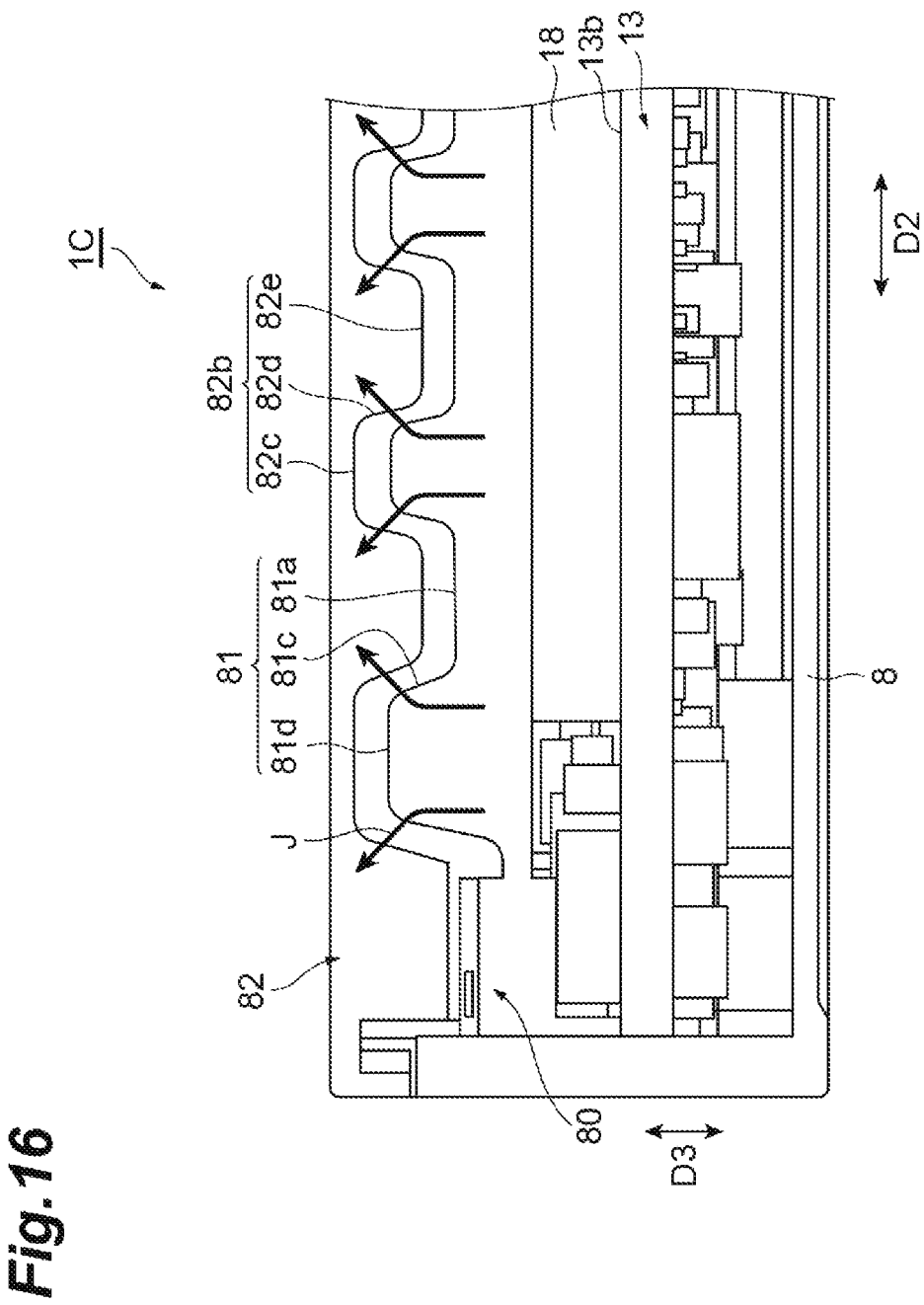

OPTICAL TRANSCEIVER

CROSS REFERENCE TO RELATED APPLICATIONS

The present application claims priority based on Japanese Patent Application No. 2019-223052, which is filed on Dec. 10, 2019, the entire content disclosed in the aforementioned Japanese patent applications being incorporated herein by reference.

TECHNICAL FIELD

The present disclosure relates to an optical transceiver.

BACKGROUND

An optical transceiver includes an optical sub assembly, a circuit board having an electrical plug that is electrically connected to an external host system, and a housing that houses the optical sub assembly and the circuit board. A circuit component is mounted on the circuit board, and the circuit component can be a heat-generating component that generates heat during operation. Therefore, it is required to dissipate the heat from the circuit component. Power consumption of the circuit component mounted on the circuit board tends to increase in accordance with an increase in a speed of a signal, and when heat dissipation is insufficient, there is a concern that a temperature of the circuit component will rise excessively, such that stable operation will not be obtained. Therefore, it is required to further improve a heat dissipation property of the circuit component.

In addition, an electrical connector may be provided at one end of the circuit board, and the circuit component of the circuit board may be electrically connected to the host system via the electrical connector. In addition, a configuration in which a heat dissipation material is interposed between the circuit component mounted on the circuit board and an inner surface of the housing to release the heat of the circuit component to the housing has been known.

SUMMARY

An optical transceiver according to one aspect of the present disclosure is an optical transceiver configured to be inserted into an apparatus in a first direction. The optical transceiver includes a circuit board having a first side and a first edge, the first edge being provided at an end thereof in the first direction; a circuit component mounted on the first side of the circuit board; an electrical connector configured to hold the first edge of the circuit board; a thermal conductive member configured to be attached on the first side of the circuit board and touch the circuit component; the thermal conductive member having a first thermal conductive face inclined with respect to the first side of the circuit board and parallel to the first direction; a filling material having a thermal conductivity; and a housing having an inner face and an inner space defined by the inner face, the housing being configured to house the circuit board, the circuit component, the thermal conductive member, and the filling material, and configured to hold the electrical connector at an end thereof in the first direction, the housing having a second thermal conductive face facing the first thermal conductive face with a spacing. The filling material adheres to the first thermal conductive face and the second thermal conductive face.

BRIEF DESCRIPTION OF THE DRAWINGS

FIG. 16 is a view schematically illustrating a cross section of the optical transceiver of FIG. 15.

DETAILED DESCRIPTION

Details of Embodiment

Figure 1:
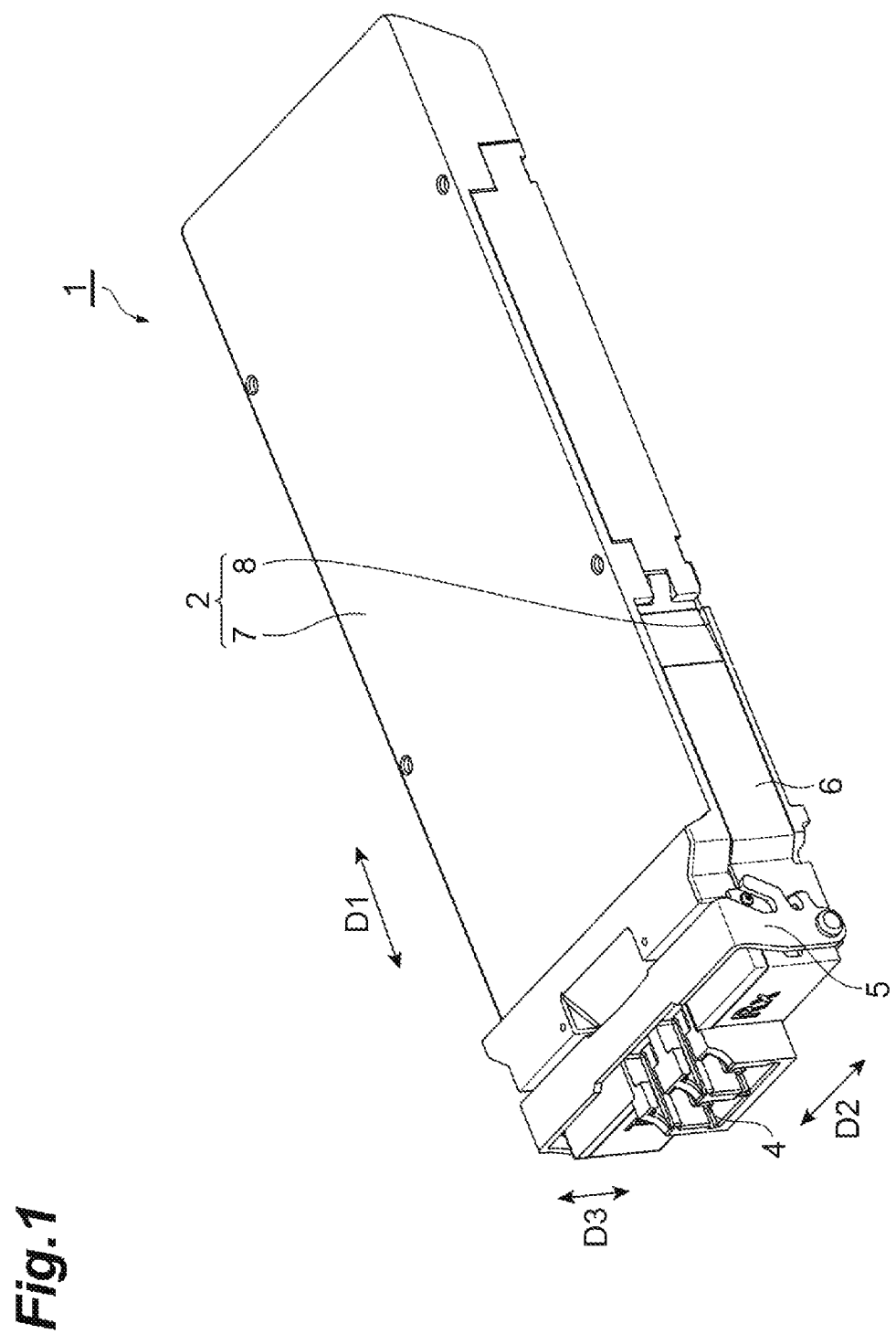
FIG. 1 is a perspective view illustrating an optical transceiver.

A specific example of an optical transceiver according to an embodiment of the present disclosure will be described below with reference to the drawings. The present invention is not limited to the following example, and is intended to include all modifications defined by the claims and falling within the scope equivalent to the claims. In the description of the drawings, the same or corresponding components will be denoted by the same reference numerals, and an overlapping description thereof will be appropriately omitted. The drawings may be partially simplified or exaggerated in order to facilitate understanding, and dimensional ratios and the like are not limited to those described in the drawings.

FIG. 1 is a perspective view illustrating an optical transceiver 1 according to an embodiment. The optical transceiver 1 is actively inserted into and extracted from a cage provided inside a host system (communication device). The optical transceiver 1 is, for example, a centum gigabit form factor pluggable (CFP) 8 module. Standard specifications of the CFP8 module have been determined in the optical transceiver industry. In the optical transceiver 1, an NRZ signal of a 25 Gbps band is multiplexed into a 4-value pulse amplitude modulation (PAM) signal, that is, a PAM4 signal (multiplexing degree 2).

For example, a transmission speed can be increased to 50 Gbps per wavelength by driving one semiconductor laser with the PAM4 signal inside a TOSA as described later. One TOSA is mounted with, for example, four semiconductor lasers and outputs four optical signals having wavelengths different from each other. Hereinafter, a signal path between a plurality of electrical signals input to and output from the optical transceiver 1 and an optical signal of one wavelength corresponding to the plurality of electrical signals may be referred to as a lane.

One TOSA can handle, for example, four lanes and performs signal transmission of 200 Gbps (50 Gbps×4 wavelengths). One ROSA, for example, includes four lanes that convert a single optical signal into a single electrical signal and performs transmission of 200 Gbps, similar to the TOSA. In the CFP8 module, two OSAs (general term of the TOSA and the ROSA) having a transmission speed of 200 Gbps are mounted in each of a transmitting portion and a receiving portion. As a result, each of the transmitting portion and receiving portion handles a total of eight lanes to achieve a transmission capacity of 400 Gbps.

The optical transceiver 1 has a rectangular parallelepiped outer shape, and includes a housing 2 extending in a longitudinal direction D1 (first direction). A material of the housing 2 is, for example, zinc. The housing 2 includes, for example, an upper housing 7 and a lower housing 8. Outer dimensions of the housing 2 conform to multi source agreement (MSA), which is an industry standard. For example, a length of the housing 2 is 106 mm, a width of the housing 2 is 40 mm, and a height of the housing 2 is 9.5 mm. The housing 2 is provided with an optical receptacle 4 receiving an external optical connector and having a sleeve 4A (see FIG. 2) having a tubular shape. The sleeve 4A includes a transmitting side sleeve transmitting a transmission multiplex signal and a receiving side sleeve receiving a reception multiplex signal from the outside. The external optical connector is, for example, an LC connector.

Hereinafter, terms "front and back", "top and bottom" and "left and right" are used in the drawings, but these terms are for convenience based on illustrated states. In the following description, the top is a direction in which the upper housing 7 is provided with respect to the lower housing 8. The front is a direction in which the optical receptacle 4 is provided with respect to the housing 2. The left and right are a width direction of the housing 2 perpendicular to each of the top and bottom and the front and back.

The optical receptacle 4 is formed at the center of the housing 2 in a width direction D2. The width direction D2 is a direction intersecting the longitudinal direction D1, and, is for example, the left and right direction described above. A veil 5 and a slider 6 are provided on both of left and right sides of the housing 2. The veil 5 is located above the optical receptacle 4 and is rotatably attached to the slider 6. When the veil 5 rotates forward and downward, the slider 6 linearly moves forward. As the slider 6 linearly moves forward, the optical transceiver 1 is disengaged from the cage of the host system. Therefore, the optical transceiver 1 can be removed from the cage (not illustrated) by rotating the veil 5 forward and downward. When the optical transceiver 1 is inserted into the cage of the host system, a tab provided in the cage is engaged with the housing 2. In an engaged state, the housing 2 cannot be extracted from the cage, and it becomes possible for the housing 2 to be extracted from the cage by rotation of the slider 6. As described above, the height of the housing 2 is about 10 mm, which is slightly larger than a width of the slider 6 (a length in a vertical direction D3 in FIG. 1). As a result, a mounting density of the optical transceiver 1 in the host system can be increased.

Figure 2:
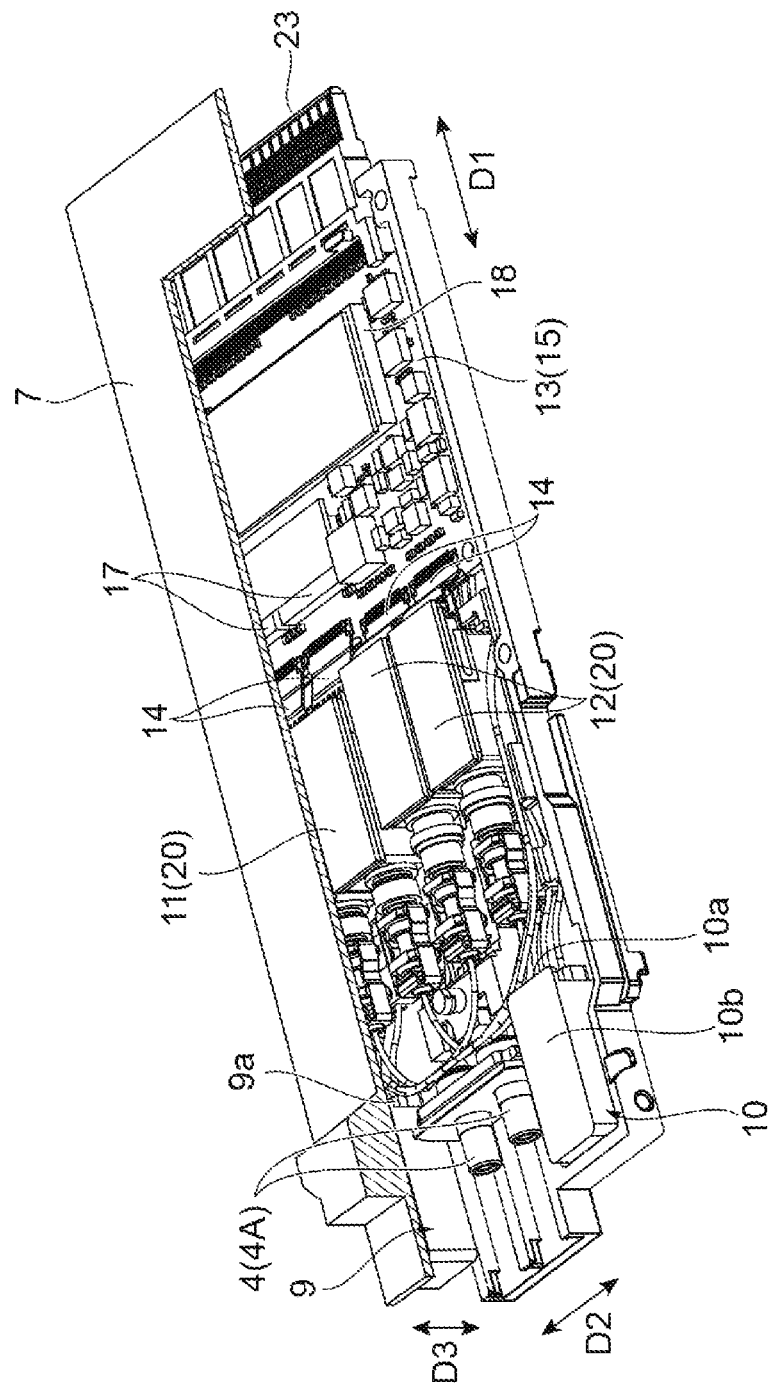
FIG. 2 is a cross-sectional perspective view illustrating an internal structure of the optical transceiver of FIG. 1.
Figure 3:
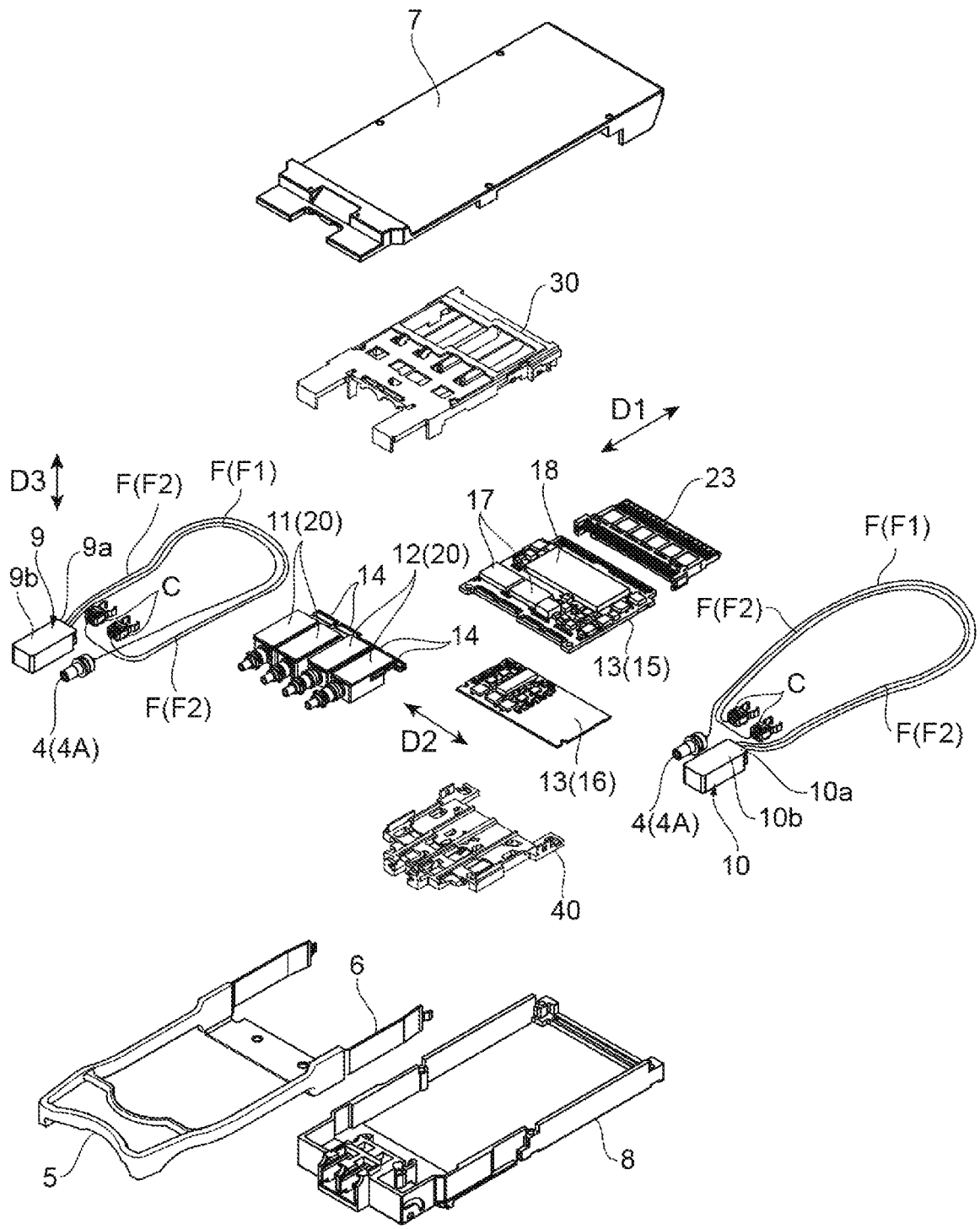
FIG. 3 is an exploded perspective view of the optical transceiver of FIG. 1.

FIG. 2 is a cross-sectional perspective view illustrating an internal structure of the optical transceiver 1 in which a part of the upper housing 7 is cut out. FIG. 3 is an exploded perspective view of the optical transceiver 1. In FIGS. 2 to 5, a heat dissipation component 50 (see FIG. 6) to be described later is not illustrated. The upper housing 7 and the lower housing 8 house, for example, the optical receptacle 4 described above, an optical-multiplexer (O-Mux) 9 and an optical-demultiplexer (O-DeMux) 10 located on left and right sides of the optical receptacle 4, respectively, transmission optical sub assemblies (TOSAs) 11, receiver optical sub assemblies (ROSAs) 12, a circuit board (printed board) 13, and flexible printed circuits (FPCs) 14. In the present specification, the optical multiplexer 9 and the optical demultiplexer 10 may be collectively referred to as an optical multiplexer/demultiplexer.

As described above, the optical transceiver 1 handles optical signals of different wavelengths in eight lanes at the transmitting portion.

The optical transceiver 1 handles optical signals of different wavelengths in eight lanes at the receiving portion. The optical demultiplexer 10 demultiplexes a wavelength multiplex optical signal in which optical signals for the eight lanes are multiplexed into a sub multiplex optical signal in which optical signals for four lanes on a long wavelength side are multiplexed and a sub multiplex optical signal in which optical signals for four lanes on a short wavelength side are multiplexed. That is, the optical demultiplexer 10 demultiplexes a reception multiplex signal to generate at least two optical signals. At the receiving portion, the two sub multiplex optical signals are optically connected to the ROSAs 12. The optical multiplexer 9 multiplexes the two sub multiplex optical signals (each for four lanes) into one wavelength multiplex optical signal (for eight lanes). That is, the optical multiplexer 9 multiplexes at least two optical signals to generate a transmission multiplex signal. At the transmitting portion, the two sub multiplex optical signals are optically connected to the TOSAs 11. In the following description, the TOSA 11 and the ROSA 12 may be collectively referred to as optical sub assembly (OSA) 20.

The optical receptacle 4 is optically connected to the OSA 20 via, for example, an internal fiber F and a simple connector C. FIG. 3 illustrates a state in which the simple connector C is separated from the OSA 20. One internal fiber F extending from the sleeve 4A and two internal fibers F toward the TOSAs 11 are optically connected to the optical multiplexer 9. Two internal fibers F extending from the ROSAs 12 and one internal fiber F toward the sleeve 4A are optically connected to the optical demultiplexer 10. A phrase "optically connected" means that an optical waveguide, an optical coupling system or the like is configured so that the wavelength multiplex optical signal and the sub multiplex optical signal described above are appropriately transmitted.

In the longitudinal direction D1, two TOSAs 11 and two ROSAs 12 are arranged behind the optical multiplexer 9 and the optical demultiplexer 10. These OSAs 20 perform photoelectric conversion between a single optical signal and a single electrical signal in each lane, for example, in a case of handling four lanes. Two internal fibers F extending from the optical multiplexer 9 or the optical demultiplexer 10 are optically connected to each OSA 20 via the simple connector C. Each internal fiber F is optically connected to an optical connection unit of each OSA 20. Optical components such as lenses and isolators that constitute the optical coupling system are built in the optical connection unit.

The optical multiplexer 9 and the optical demultiplexer 10 have, for example, the same shape and the same outer dimensions. The optical multiplexer 9 and the optical demultiplexer 10 may have protrusions 9a and 10a protruding rearward at bottom portions 9b and 10b thereof, respectively. Three internal fibers F are drawn out from each of the optical multiplexer 9 and the optical demultiplexer 10 in a pigtail manner Here, the pigtail manner means that the internal fibers protrude to the outside in a state in which they are fixed to a package. The internal fibers F are directly optically connected to an internal optical system in each of the optical multiplexer 9 or the optical demultiplexer 10 and the optical receptacle 4. The internal fibers F drawn out by the pigtail manner are integrally connected to the optical multiplexer 9 or the optical demultiplexer 10, such that the internal fibers F cannot be easily removed.

The internal fiber F includes a first internal fiber F1 and a second internal fiber F2. Each of the optical multiplexer 9 and the optical demultiplexer 10 is optically connected to the optical receptacle 4 via the first internal fiber F1. Each of the optical multiplexer 9 and the optical demultiplexer 10 is optically connected to the simple connector C (OSA 20) via the second internal fiber F2.

Each OSA 20 is mounted on the circuit board 13 having a flat plate shape via a first holding member 30 and a second holding member 40. As a result, an electrical connection between the FPC 14 connected to each OSA 20 and the circuit board 13 can be protected (reinforced) from stress. Therefore, reliability of the connection can be improved. The circuit board 13 is mounted with a circuit component electrically connected to the OSA 20 via the FPC 14. The circuit board 13 is arranged behind the OSA 20.

The circuit board 13 includes a first circuit board 15 located on an upper side and a second circuit board 16 located on a lower side. Circuit components including two LD drivers 17 facing the two TOSAs 11, a digital signal processor (DSP) 18 located behind the LD drivers 17, a clock data recovery (CDR), a preamplifier IC, and the like, are mounted on the first circuit board 15. The DSP 18 is a signal processing IC, and executes signal processing for eight electrical signals of the transmitting portion and eight electrical signals of the receiving portion. The DSP 18 converts, for example, an NRZ signal of 25 Gbps into a PAM4 signal.

The second circuit board 16 is electrically connected to the first circuit board 15 located above the second circuit board 16 via a stack connector. By using the stack connector, it is possible to realize an electrical connection in a saved space as compared with the FPC. The first circuit board 15 has circuit components mounted on both surfaces thereof, for example. The second circuit board 16 has circuit components mounted only on an upper surface thereof, for example. For example, the first circuit board 15 is arranged between the upper housing 7 and the second circuit board 16, and the second circuit board 16 is arranged between the first circuit board 15 and the lower housing 8. In addition, the optical transceiver 1 has an electrical connector 23 fitted to one end of the circuit board 13 in the longitudinal direction D1. The electrical connector 23 is a plug board provided behind the circuit board 13 in the longitudinal direction D1 and different from the circuit board 13. The electrical connector 23 is engaged with an electrical connector (socket) provided in the cage of the host system.

In order to secure an electrical connection between the electrical connector provided in the cage and the electrical connector 23, it is necessary to increase an engaging force between the electrical connector and the electrical connector 23 in the cage. In this case, in order to insert and extract the electrical connector 23 of the optical transceiver 1 into and from the electrical connector in the cage, an insertion and extraction force exceeding the engaging force is required. In order to prevent an insertion and extraction force (stress) exerted on the electrical connector 23 from spreading to the circuit board 13 at the time of inserting and extracting the optical transceiver 1 and in order to firmly engage the electrical connector 23 with the electrical connector in the cage, the electrical connector 23 is separated from the circuit board 13 so as to be a member separate from the circuit board 13. The circuit board 13 and the electrical connector 23 are connected to each other along the longitudinal direction D1 and are soldered and mounted together.

Figure 4:
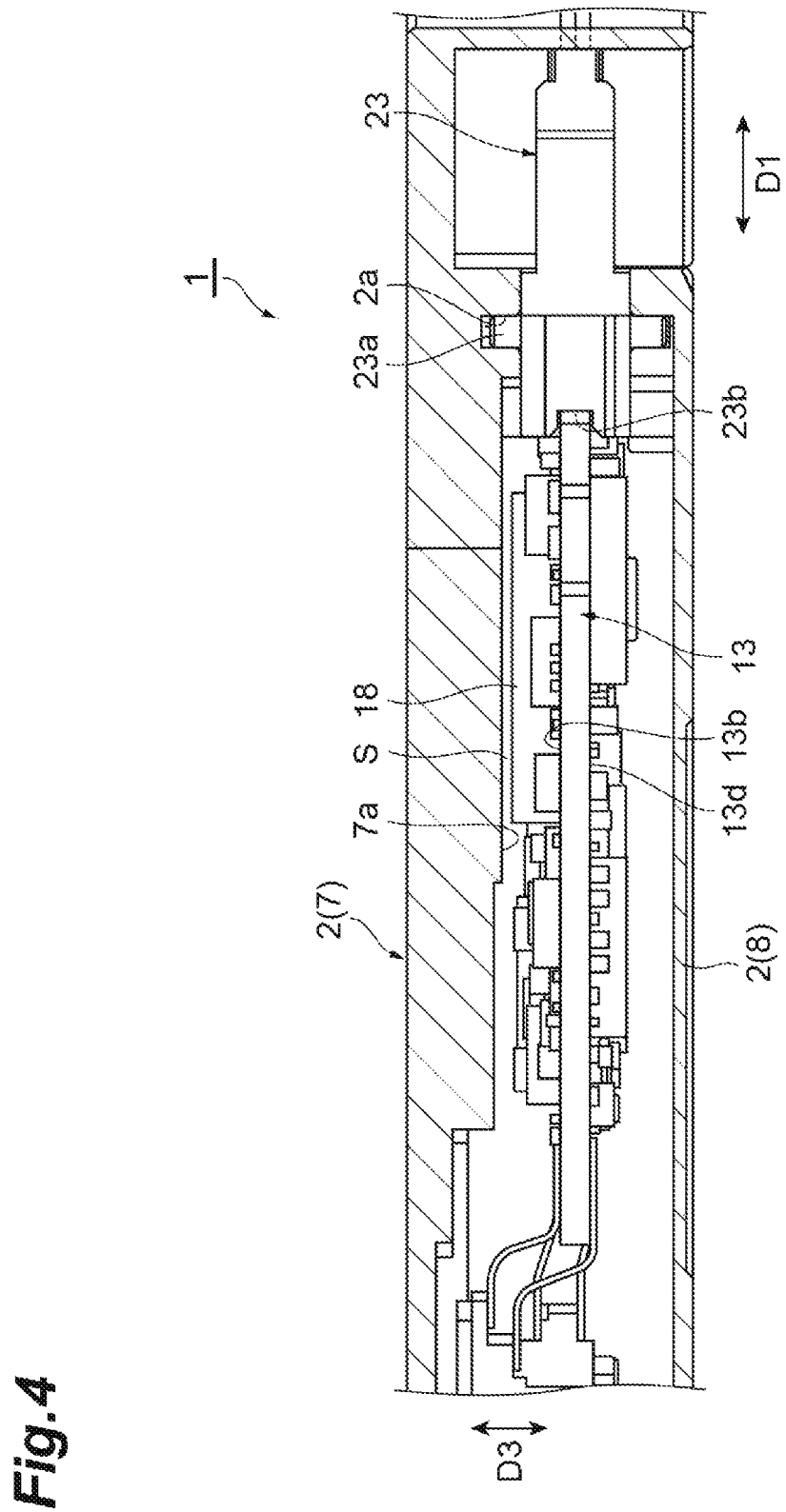
FIG. 4 is a cross-sectional view illustrating the internal structure of the optical transceiver of FIG. 1.

FIG. 4 is a cross-sectional view illustrating the internal structure of the optical transceiver 1. As illustrated in FIG. 4, the electrical connector (plug) 23 has a projection 23a that protrudes upward. The housing 2 has a recess 2a that the projection 23a enters. The electrical connector 23 is held in the housing 2 in a state in which the electrical connector 23 is sandwiched between the upper housing 7 and the lower housing 8 and in a state in which the projection 23a enters the recess 2a of the housing 2. The electrical connector 23 has a recess (internal socket) 23b at one end thereof in the longitudinal direction D1. The circuit board 13 enters the recess 23b, such that the electrical connector 23 is fitted to one end (internal plug) of the circuit board 13.

The circuit board 13 has, for example, an upper surface (first surface) 13b on which the DSP 18 is mounted, and a plurality of circuit components including the DSP 18 are mounted on the first surface 13b. The first surface 13b faces an inner surface 7a of the upper housing 7. By the way, power consumption of a signal processing IC such as the DSP 18 tends to increase in accordance with an increase in a speed of a signal of the optical transceiver 1, such that the signal processing IC may generate heat. Therefore, in order to normally maintain a circuit operation, it is required to dissipate heat from the DSP 18 or the like (circuit component) mounted on the circuit board 13. For this reason, a heat dissipation material may be interposed in a space S between the inner surface 7a of the upper housing 7 and the circuit component.

Figure 5:
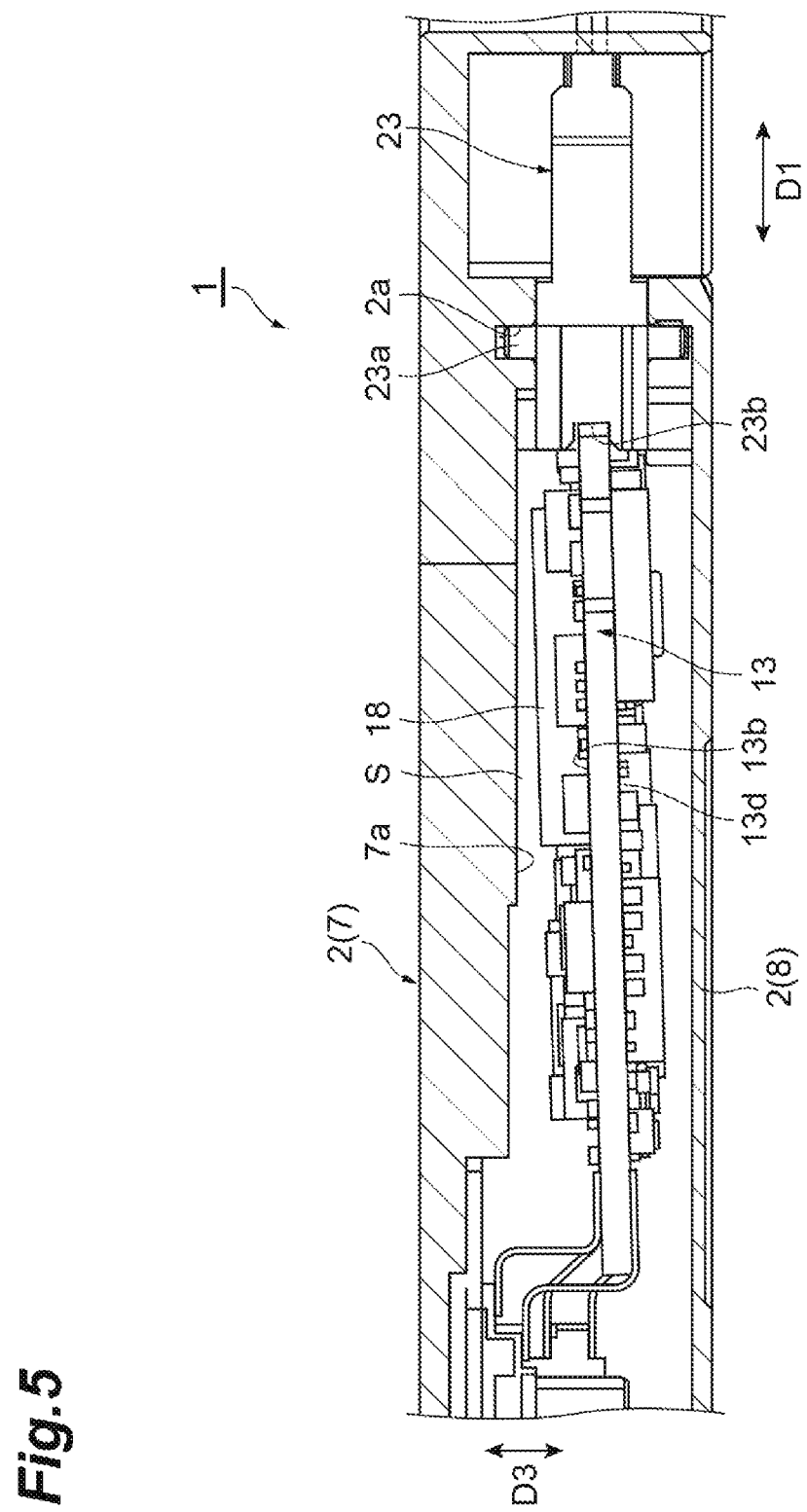
FIG. 5 is a cross-sectional view illustrating a state in which a circuit board is inclined with respect to an electrical connector of the optical transceiver of FIG. 4.

However, for example, as illustrated in FIG. 5, when the circuit board 13 is inclined with respect to the electrical connector 23 fixed to the housing 2 (upper housing 7 and lower housing 8), even though the heat dissipation material is interposed in the space S, the circuit component and the heat dissipation material or the heat dissipation material and the inner surface 7a may be spaced apart from each other. Then, a heat path from the circuit component to the upper housing 7 may not be secured. In addition, a part (ground wiring) of the circuit board 13 and the housing 2 are grounded together. However, the circuit board 13 needs to be a signal ground, and the housing 2 needs to be a frame ground. For this reason, it is required to secure an electrical insulation property of the circuit board 13 and the housing 2.

Figure 6:
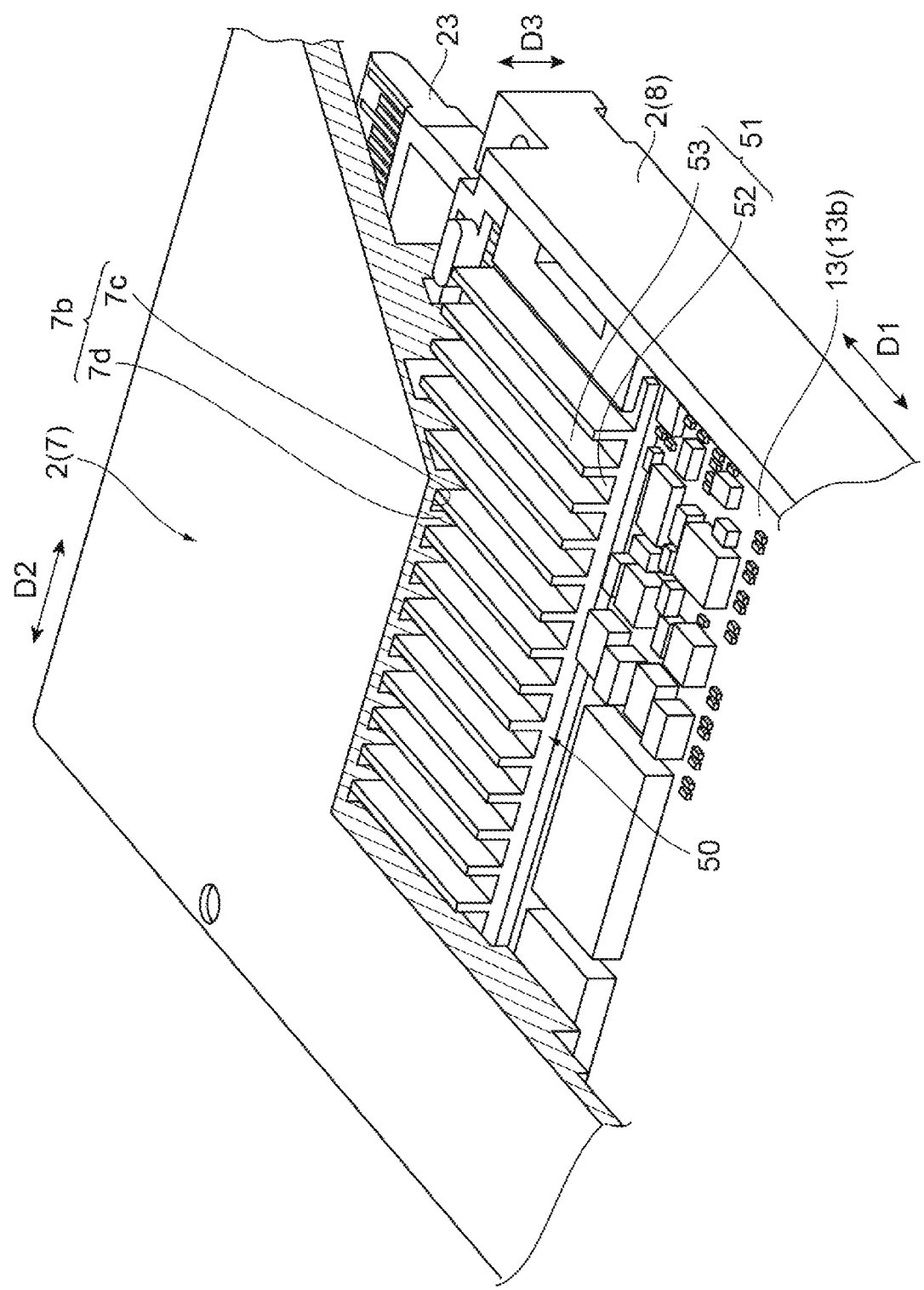
FIG. 6 is a partial cross-sectional perspective view illustrating an internal structure of an optical transceiver including a heat dissipation component according to the present embodiment.

As illustrated in FIG. 6, a heat dissipation component 50 (thermal conductive member) having an uneven surface 51 (first uneven surface) is interposed between the circuit board 13 and the housing 2 (upper housing 7). The heat dissipation component 50 is formed of, for example, a material having higher thermal conductivity than the housing 2. As an example, a material of the heat dissipation component 50 is copper. When the heat dissipation component 50 is formed of copper, it is possible to efficiently exhaust heat from the circuit component to the upper housing 7 due to high thermal conductivity of copper. However, the material of the heat dissipation component 50 may be other than copper, and can be appropriately changed as long as it is a material having high thermal conductivity.

The uneven surface 51 (first uneven surface) of the heat dissipation component 50 is formed by alternately arranging recesses 52 extending along the longitudinal direction D1 and projections 53 extending along the longitudinal direction D1 along the width direction D2. The uneven surface 51 has a comb shape in a cross section along the width direction D2. Meanwhile, an uneven surface 7b (second uneven surface) is formed on the inner surface 7a of the upper housing 7. The uneven surface 7b is formed by alternately arranging recesses 7c extending along the longitudinal direction D1 and projections 7d extending along the longitudinal direction D1 along the width direction D2. The uneven surface 51 and the uneven surface 7b face each other so that the projections 53 enter the recesses 7c and the projections 7d enter the recess 52.

Figure 7:
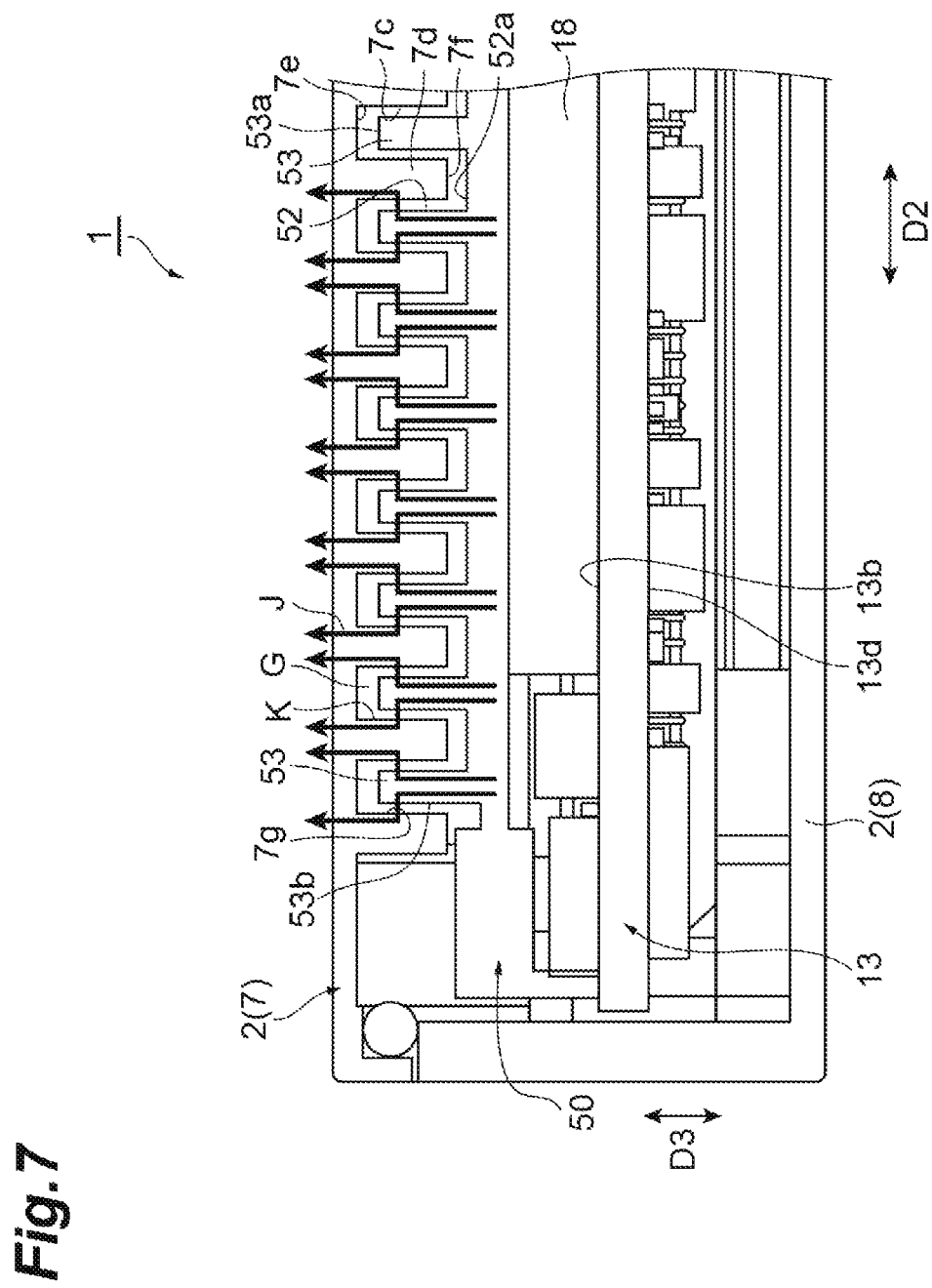
FIG. 7 is a view schematically illustrating a cross section of the optical transceiver of FIG. 6.

FIG. 7 is a view schematically illustrating a cross section of the housing 2, the heat dissipation component 50, the circuit board 13, and the circuit component such as the DSP 18 cut by a plane extending in both of the width direction D2 and the vertical direction of the optical transceiver 1. As illustrated in FIG. 7, a top surface 53a of each projection 53 of the heat dissipation component 50 is spaced apart from a bottom surface 7e of each recess 7c of the upper housing 7. A top surface 7f of each projection 7d of the upper housing 7 is spaced apart from a bottom surface 52a of each recess 52. A side surface 53b (first heat conduction surface) of each projection 53 faces a side surface 7g (second heat conduction surface) of each projection 7d along the width direction D2. The side surface 53b (first heat conduction surface) is a plane perpendicular to the upper surface (first surface) 13b of the circuit board 13 and parallel to the longitudinal direction D1 (first direction). The side surface 7g (second heat conduction surface) faces the side surface 53b (first heat conduction surface) while being spaced apart from the side surface 53b. That is, the side surface 7g (second heat conduction surface) is parallel to the side surface 53b (first heat conduction surface) and is arranged at a certain interval from the side surface 53b (first heat conduction surface). The uneven surface 51 and the uneven surface 7b each have comb shapes along the width direction D2, and are arranged so that the respective comb shapes mesh with each other without being in contact with each other. For example, a lateral width of the top surface 7f is set to be smaller than a lateral width of the bottom surface 52a. A lateral width of the top surface 53a is set to be smaller than a lateral width of the bottom surface 7e. For example, the lateral width of the top surface 7f is set to the same value as the lateral width of the top surface 53a. By setting the lateral width of the bottom surface 7e to the same value as the lateral width of the bottom surface 52a, it is possible to obtain a structure in which the comb shapes described above mesh with each other. Therefore, a gap K is formed between each of the bottom surface 7e, the top surface 7f, and the side surface 7g (second heat conduction surface) of the uneven surface 7b, and the top surface 53a, the bottom surface 52a, and the side surface 53b (first heat conduction surface) of the uneven surface 51, and the gap K is filled with the heat dissipation material G (filling material). It should be noted that the heat dissipation material G may not fill the entire region of the gap K, and the heat dissipation material G is only required to be provided so as to be in close contact with each of the bottom surface 7e, the top surface 7f, and the side surface 7g (second heat conduction surface) of the uneven surface 7b, and the top surface 53a, the bottom surface 52a, and the side surface 53b (first heat conduction surface) of the uneven surface 51, such that sufficient thermal conductivity is obtained between the uneven surface 7b and the uneven surface 51. It is preferable that the heat dissipation material G has good thermal conductivity and can be easily deformed (has plasticity) without repelling stress. The heat dissipation material G is, for example, a heat dissipation gel. With the configurations of the heat dissipation component 50 and the upper housing 7 described above, heat paths J from the circuit component mounted on the circuit board 13 to the heat dissipation component 50 and the upper housing 7 are secured. The heat dissipation material G has a high insulation property. Therefore, insulation between the heat dissipation component 50 and the upper housing 7 is secured. The heat dissipation material G may be, for example, a heat dissipation grease or a heat dissipation compound.

Figure 8:
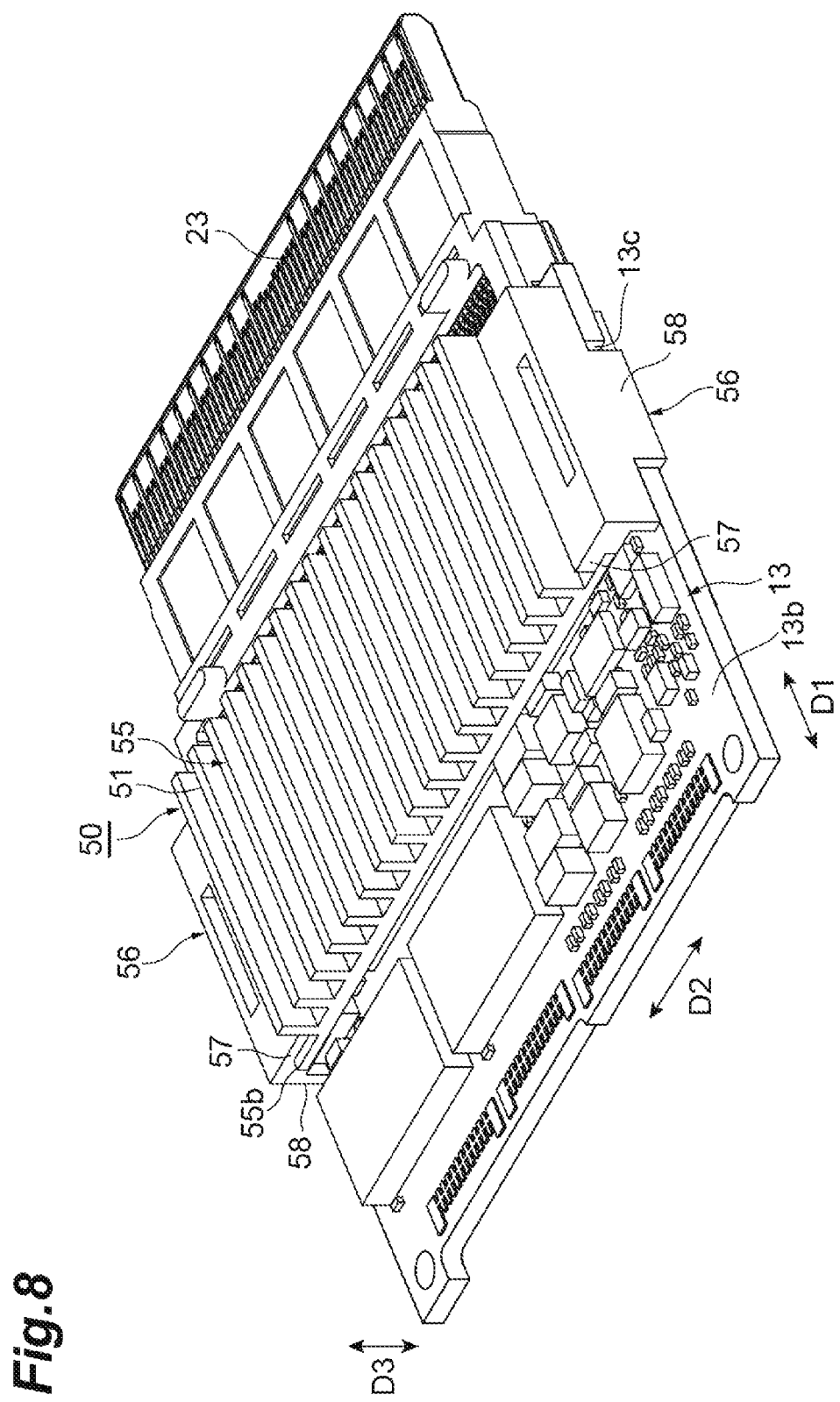
FIG. 8 is a perspective view illustrating the circuit board, the electrical connector, and the heat dissipation component of the optical transceiver of FIG. 6.
Figure 9:
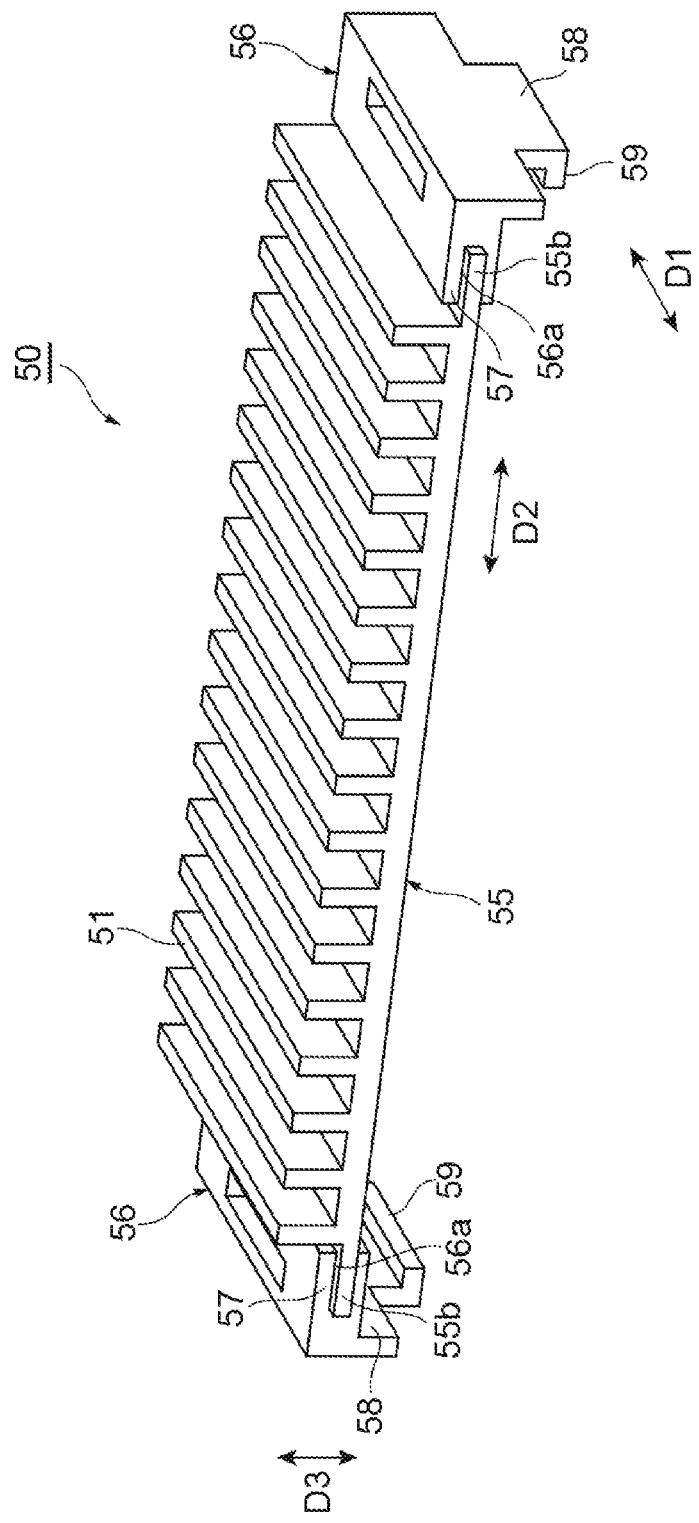
FIG. 9 is a perspective view illustrating the heat dissipation component of FIG. 8 and a holding component for holding the heat dissipation component on the circuit board.
Figure 10:
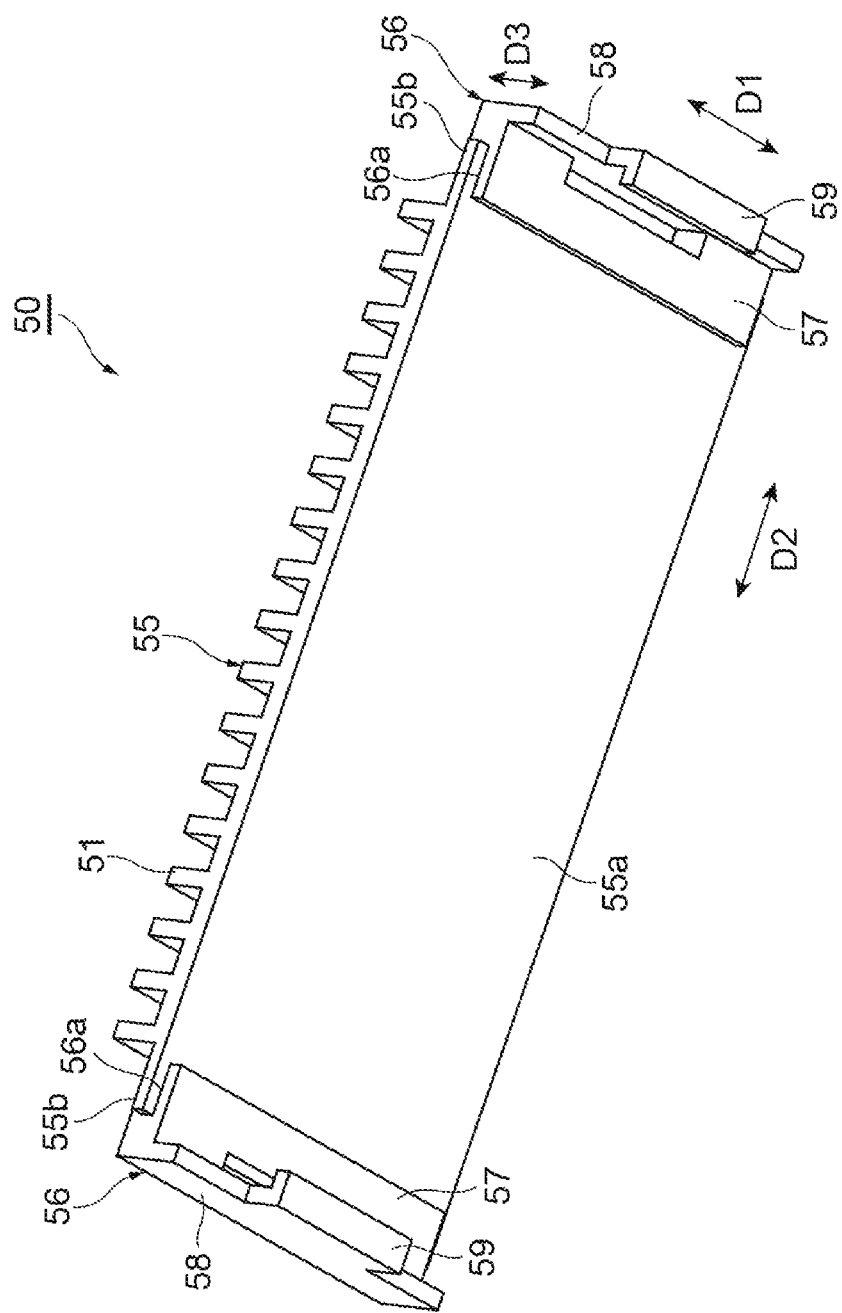
FIG. 10 is a perspective view of the heat dissipation component and the holding component of FIG. 9, when viewed from a direction different from that of FIG. 9.

FIG. 8 is a perspective view illustrating the heat dissipation component 50 fixed to the circuit board 13. FIG. 9 is a perspective view of the heat dissipation component 50 when viewed from above. FIG. 10 is a perspective view of the heat dissipation component 50 when viewed from below. As illustrated in FIGS. 8 to 10, the heat dissipation component 50 includes, for example, a heat dissipation portion 55 having an uneven surface 51 and holding components 56 provided at both ends of the heat dissipation portion 55 in the width direction D2. A surface 55a of the heat dissipation portion 55 opposite to the uneven surface 51 is, for example, a flat surface. The circuit component is in contact with the surface 55a, which is the flat surface, such that heat from the circuit component can be efficiently dissipated. It should be noted that the surface 55a may have unevenness depending on heights of the respective circuit components in order to be in contact with upper surfaces of the plurality of circuit components. The surface 55a and the circuit component may not be in direct contact with each other, but a heat dissipation material may be filled between the surface 55a and the circuit component to dissipate heat. Plate-shaped portions 55b protruding outward in the width direction D2 are provided at both ends of the heat dissipation portion 55 in the width direction D2, respectively. Each holding component 56 has a recess 56a that sandwiches the plate-shaped portion 55b.

The holding component 56 includes, for example, a sandwiching portion 57 in which the recess 56a is formed, a first protrusion 58 protruding downward from the sandwiching portion 57, and a second protrusion 59 protruding toward the center of the heat dissipation component 50 in the width direction D2 at a lower end of the first protrusion 58. A recess 13c that the first protrusion 58 enters is formed inward from each of both ends of the circuit board 13 in the width direction D2. The recess 13c has a rectangular shape as an example. Each of the first protrusions 58 enters each recess 13c. The heat dissipation component 50 is held on the circuit board 13 by the second protrusion 59 entering the inside of the recess 13c below a lower surface 13d of the circuit board 13 (a surface opposite to the first surface 13b in the vertical direction D3). That is, the holding component 56 fixes the heat dissipation portion 55 to the circuit board 13 by holding the heat dissipation portion 55 by the sandwiching portion 57 and holding the circuit board 13 by the sandwiching portion 57 and the second protrusion 59. At this time, a gap is formed between the surface 55a of the heat dissipation portion 55 and the first surface 13b of the circuit board 13, and the circuit component of the circuit board 13 is interposed in this gap.

Next, an action effect obtained from the optical transceiver 1 according to the present embodiment will be described. In the optical transceiver 1, the circuit component is mounted on the first surface 13b of the circuit board 13 having the flat plate shape, and the heat dissipation component 50 in contact with the circuit component is provided. Therefore, heat from the circuit component generated by the heat dissipation component 50 in contact with the circuit component can be dissipated through the heat dissipation component 50.

The optical transceiver 1 includes the electrical connector 23 fitted to one end of the circuit board 13 and the housing 2 enclosing the circuit board 13 and the heat dissipation component 50 and holding the electrical connector 23. The heat dissipation component 50 has the uneven surface 51, and the housing 2 has the uneven surface 7b. The uneven surface 51 of the heat dissipation component 50 and the uneven surface 7b of the housing 2 are arranged so that the other projection (for example, the projection 53) enters one recess (for example, the recess 7c), and one projection (for example, the projection 7d) enters the other recess (for example, the recess 52). At the time, for example, the side surface 53b (first heat conduction surface) of the projection 53 is a plane perpendicular to the upper surface (first surface) 13b of the circuit board 13 and parallel to the longitudinal direction D1 (first direction). The side surface 7g (second heat conduction surface) of the projection 7d faces the side surface 53b (first heat conduction surface) while being spaced apart from the side surface 53b. The heat dissipation material G is interposed between the uneven surface 51 and the uneven surface 7b, and the uneven surface 51 and the uneven surface 7b are thermally connected to each other via the heat dissipation material G. A phrase "thermally connected" indicates that both of heat of the uneven surface 51 and heat of the uneven surface 7b are easily conducted between the uneven surface 51 and the uneven surface 7b. For example, the uneven surface 51 and the uneven surface 7b are thermally connected to each other, such that it becomes possible to improve a thermal resistance between the heat dissipation component 50 and the housing 2 from a fraction to one several tenths or less as compared with a case where the heat dissipation material G is not filled between the uneven surface 51 and the uneven surface 7b. The heat dissipation material G may be filled with no gap between the uneven surface 51 and the uneven surface 7b, but the heat dissipation material G may be filled with a gap between the uneven surface 51 and the uneven surface 7b within a range in which efficient thermal conductivity is not damaged. For example, the heat dissipation material G is only required to be in close contact with the side surface 53b (first heat conduction surface) of the projection 53 and the side surface 7g (second heat conduction surface) of the projection 7d opposing the side surface 53b and be filled between the side surface 53b (first heat conduction surface) and the side surface 7g (second heat conduction surface). Therefore, even though the circuit board 13 is inclined in the vertical direction D3 in which the heat dissipation component 50 is fixed, with respect to the electrical connector 23 held in the housing 2, the heat dissipation material G is deformable with respect to stress. For this reason, each of the recess 52 and the projection 53 of the uneven surface 51 of the heat dissipation component 50 and each of the projection 7d and the recess 7c of the uneven surface 7b of the housing 2 are maintained in a state where they are fitted to each other via the heat dissipation material G. For example, even though the circuit board 13 is inclined in the vertical direction D3, the side surface 53b (first heat conduction surface) moves relatively with respect to the side surface 7g (second heat conduction surface) in the vertical direction D3, but an interval between the side surface 53b (first heat conduction surface) and the side surface 7g (second heat conduction surface) is kept constant and the heat dissipation material G filled between the side surface 53b (first heat conduction surface) and the side surface 7g (second heat conduction surface) is deformable, and a heat conduction path between the side surface 53b (first heat conduction surface) and the side surface 7g (second heat conduction surface) is thus secured. Therefore, even though the circuit board 13 is inclined with respect to the electrical connector 23, a state in which the uneven surface 51 of the heat dissipation component 50 and the uneven surface 7b of the housing 2 are thermally connected to each other is maintained, and the heat paths J from the heat dissipation component 50 to the housing 2 can thus be secured. As a result, the heat paths J from the circuit component to the housing 2 can be secured to improve a heat dissipation property.

Each of the uneven surface 51 of the heat dissipation component 50 and the uneven surface 7b of the housing 2 extends in the longitudinal direction D1. Therefore, even though the electrical connector 23 is fitted to one end of the longitudinal direction D1 of the circuit board 13 and the circuit board 13 is tilted in the vertical direction D3 with respect to the electrical connector 23 fixed to the housing 2, a meshing state between the uneven surface 51 and the uneven surface 7b extending in the longitudinal direction D1 is maintained. For example, the side surface 7g (second heat conduction surface) of the projection 7d is maintained in a state in which it faces the side surface 53b (first heat conduction surface) of the projection 53 while being spaced apart from the side surface 53b by a certain interval. Therefore, even though the circuit board 13 is inclined in the vertical direction D3 from the electrical connector 23 in the circuit board 13 and the electrical connector 23 connected to each other along the longitudinal direction D1, the heat dissipation material G is deformable with respect to the stress, and a state in which the uneven surface 51 and the uneven surface 7b are thermally connected to each other is thus maintained. Therefore, even though the circuit board 13 is inclined in the vertical direction D3 with respect to the electrical connector 23, the heat paths J from the circuit component to the housing 2 can be secured. That is, the heat generated by the circuit component can be efficiently conducted to the housing 2 via the heat dissipation component 50 and the heat dissipation material G.

Figure 11:
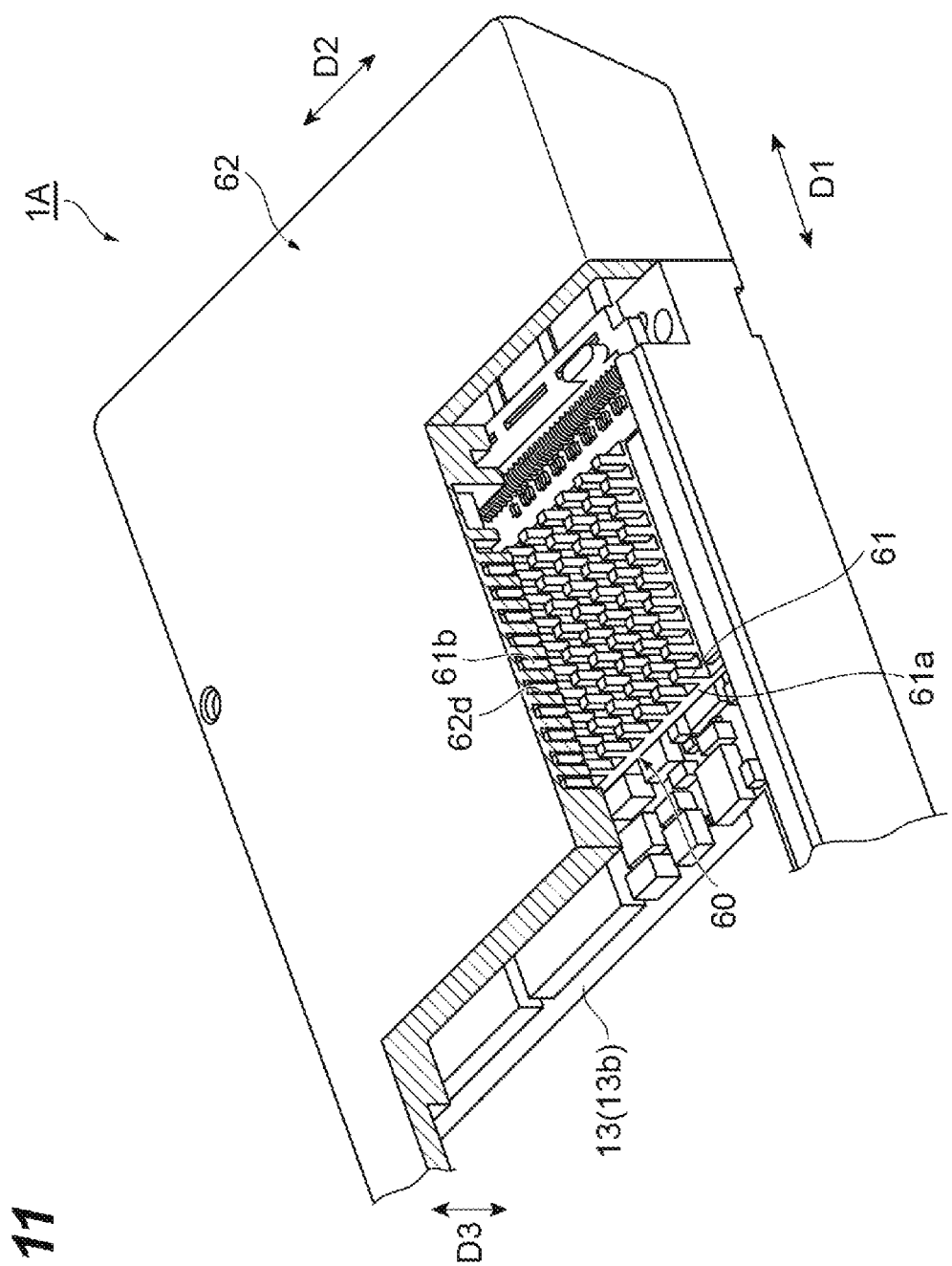
FIG. 11 is a partial cross-sectional perspective view illustrating an internal structure of an optical transceiver according to a modification.
Figure 12:
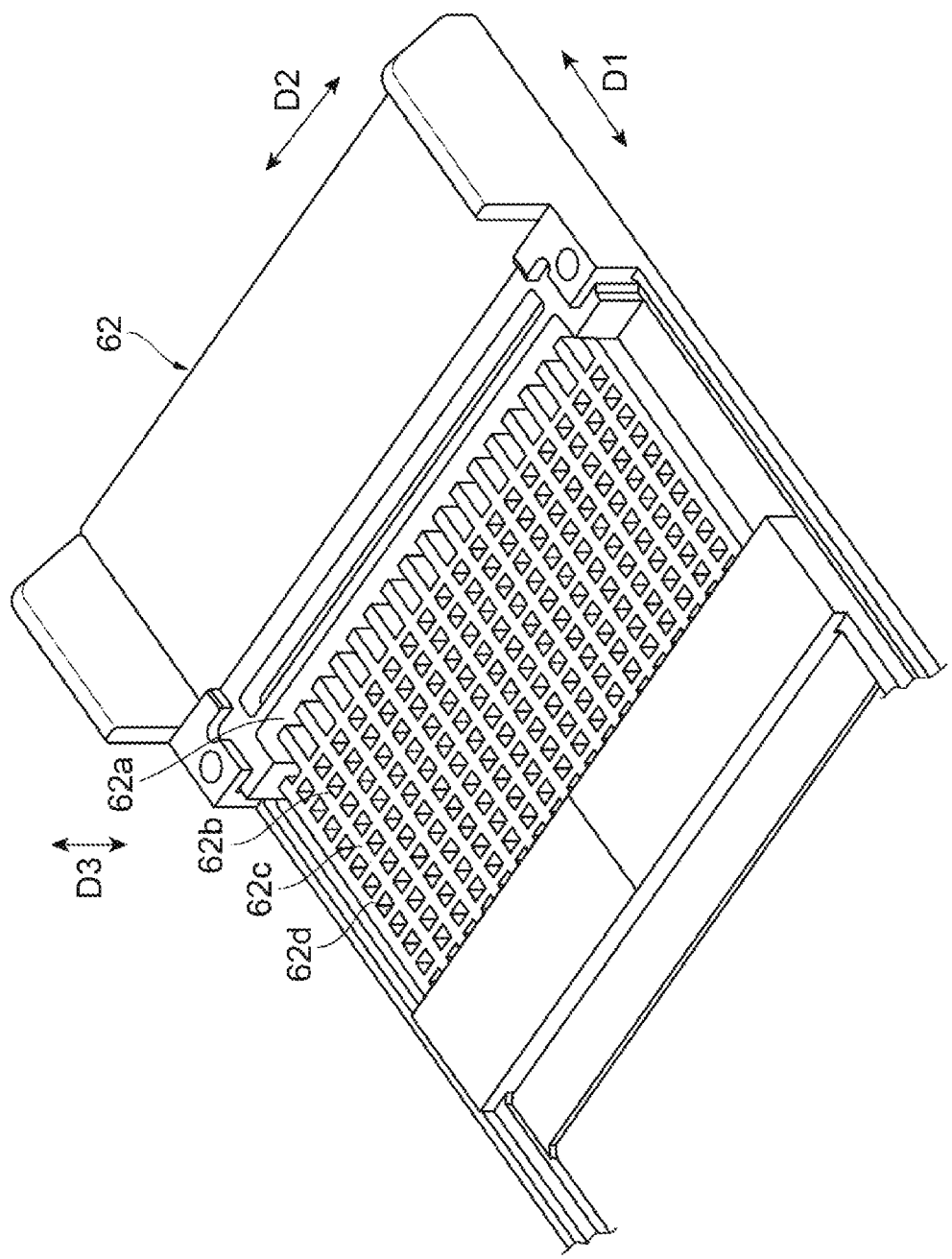
FIG. 12 is a perspective view illustrating a housing of the optical transceiver of FIG. 11.

Next, an optical transceiver 1A according to a modification will be described with reference to FIGS. 11 and 12. Hereinafter, in order to avoid an overlapping description, a description overlapping the optical transceiver 1 described above will be appropriately omitted. The optical transceiver 1A includes a heat dissipation component 60 and a housing 62 having shapes different from those of the heat dissipation component 50 and the housing 2. The heat dissipation component 60 has an uneven surface 61 (first uneven surface), and an uneven surface 62b facing the uneven surface 61 is formed on an inner surface 62a of the housing 62. The uneven surface 61 is formed by a base 61a extending in both of the longitudinal direction D1 and the width direction D2 and having a plate shape and a plurality of pillars 61b protruding upward from the base 61a. The uneven surface 62b is formed by a flat surface 62c extending in both of the longitudinal direction D1 and the width direction D2, and a plurality of concavities 62d recessed from the flat surface 62c. The uneven surface 61 and the uneven surface 62b are arranged so that the base 61a faces the flat surface 62c and the pillars 61b enter the concavities 62d.

The optical transceiver 1A according to the modification is different from the optical transceiver 1 in that the uneven surface 61 formed as the base 61a and the pillars 61b substitutes for the uneven surface 51 formed as the recesses 52 and the projections 53 and in that the uneven surface 62b formed as the concavities 62d and the flat surface 62c substitutes for the uneven surface 7b formed as the recesses 7c and the projections 7d. Similar to the optical transceiver 1 described above, a heat dissipation material G having an insulation property is interposed between the uneven surface 61 and the uneven surface 62b. A shape of the pillar 61b and a shape of the concavity 62d are, for example, rectangular. In the base 61a, for example, the pillars 61b are arranged in a lattice shape along each of the longitudinal direction D1 and the width direction D2, and the concavities 62d are also arranged in a lattice shape in a similar manner. For example, one pillar 61b has a plane (first heat conduction surface) perpendicular to the upper surface (first surface) 13b of the circuit board 13 and parallel to the longitudinal direction D1 (first direction), and the concavity 62d that the one pillar enter has a plane (second heat conduction surface) facing the plane while being spaced apart from the plane. A heat dissipation material G is filled between the pillar 61b entering the concavity 62d and the concavity 62d. However, shapes, sizes, the numbers, and arrangement aspects of pillars and concavities can be appropriately changed. For example, an interval between where the pillars 61b are arranged in the longitudinal direction D1 may be set to be larger than an interval between the pillars 61b arranged in the width direction D2.

As described above, in the optical transceiver 1A according to the modification, the uneven surface 61 of the heat dissipation component 60 is formed by the plurality of pillars 61b, the uneven surface 62b of the housing 62 is formed by the plurality of concavities 62d, and the plurality of pillars 61b and the plurality of concavities 62d are arranged along each of the longitudinal direction D1 and the width direction D2. The pillar 61b entering the concavity 62d and the concavity 62d have the planes facing each other, respectively, as described above. An interval between the planes facing each other is maintained even though the circuit board 13 is inclined in the vertical direction D3, and a heat dissipation material G filled between the planes facing each other is deformable. Therefore, a heat conduction path is secured between the pillar 61b and the concavity 62d. Further, the uneven surface 61 is formed by the plurality of pillars 61b and the uneven surface 62b is formed by the plurality of concavities 62d, such that surface areas of the uneven surface 61 and the uneven surface 62b can be increased. In other words, the number of planes facing each other between the pillars 61b and the concavities 62d can be increased. As a result, more heat paths J from the heat dissipation component 60 in contact with the circuit component to the housing 62 can be secured, and a heat dissipation property can thus be further improved.

Figure 13:
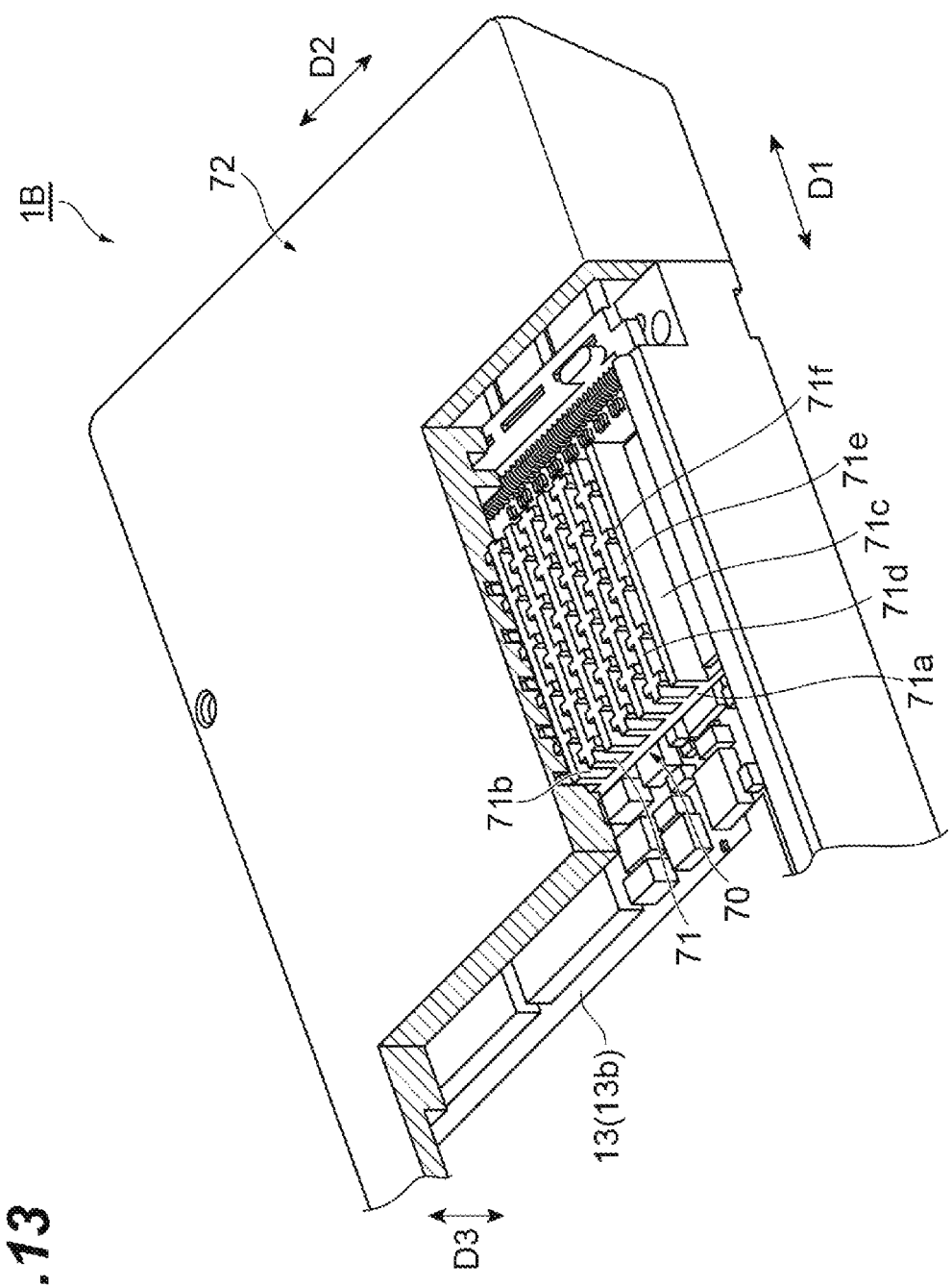
FIG. 13 is a partial cross-sectional perspective view illustrating an internal structure of an optical transceiver according to another modification.
Figure 14:
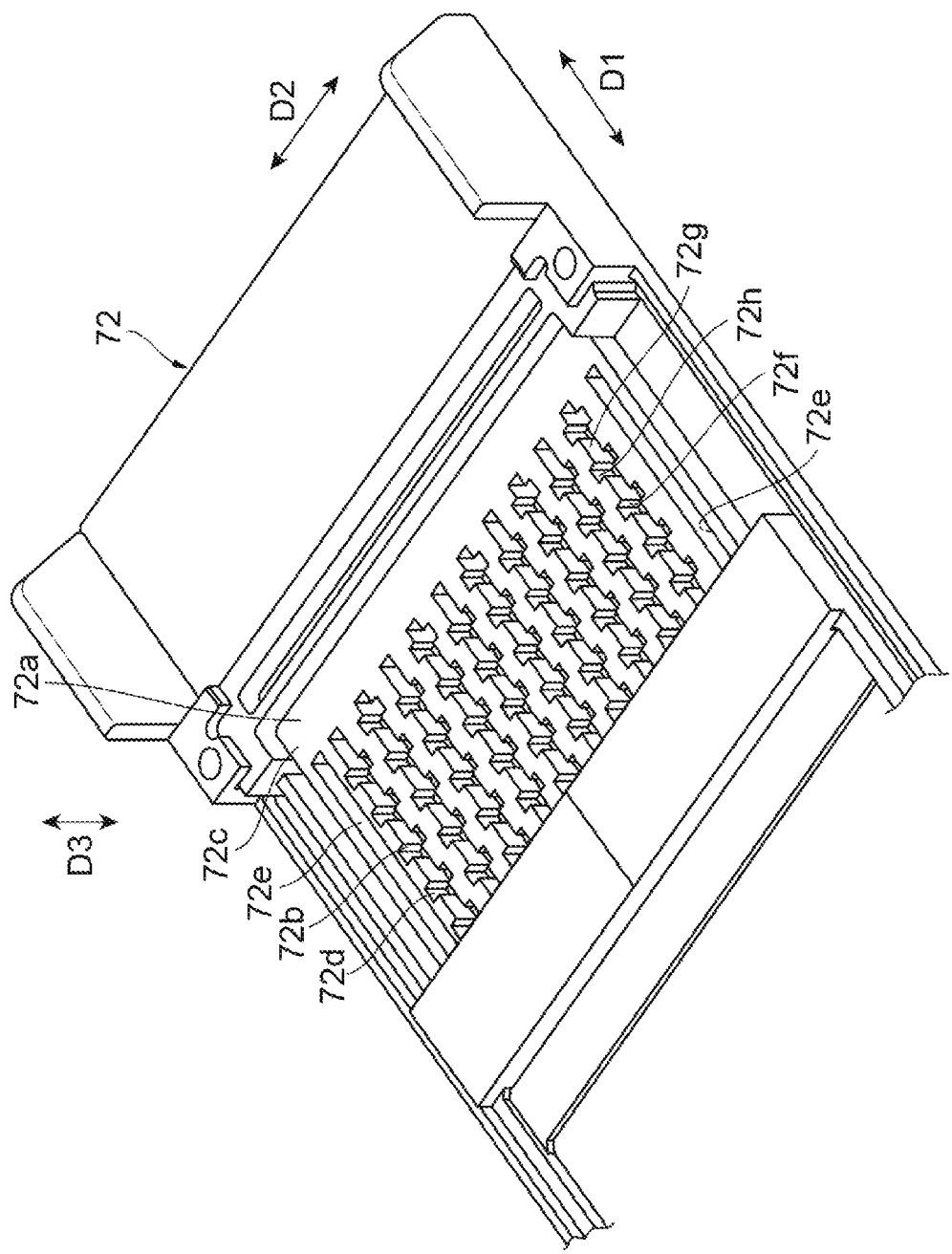
FIG. 14 is a perspective view illustrating a housing of the optical transceiver of FIG. 13.

Next, an optical transceiver 1B according to another modification will be described with reference to FIGS. 13 and 14. The optical transceiver 1B includes a heat dissipation component 70 and a housing 72 having shapes different from those described above. The heat dissipation component 70 has an uneven surface 71 (first uneven surface), and an uneven surface 72b (second uneven surface) facing the uneven surface 71 is formed on an inner surface 72a of the housing 72. The uneven surface 71 is formed by a base 71a extending in both of the longitudinal direction D1 and the width direction D2 and having a plate shape and a plurality of wall portions 71b protruding upward from the base 71a. The wall portions 71b include first wall portions 71c located at each of both ends of the width direction D2 and a plurality of second wall portions 71d located closer to a center side of the heat dissipation component 70 in the width direction D2 than the first wall portions 71c. The first wall portion 71c has a plate shape extending in both of the longitudinal direction D1 and the vertical direction D3. The second wall portion 71d has a plate-shaped portion 71e extending in both of the longitudinal direction D1 and the vertical direction D3 and a plurality of protrusions 71f protruding from the plate-shaped portion 71e in the width direction D2. The protrusion 71f of the second wall portion 71d is arranged at a position that does not interfere with a protrusion 71f of an adjacent second wall portion 71d. For example, the second wall portions 71d adjacent to each other each have comb shapes in which the protrusions 71f are arranged at regular intervals in the longitudinal direction D1, and are formed so that the respective comb shapes mesh with each other without being in contact with each other.

The uneven surface 72b of the housing 72 is formed by a flat surface 72c extending in both of the longitudinal direction D1 and the width direction D2, and a plurality of concavities 72d recessed from the flat surface 72c. The concavities 72d include first concavities 72e located at each of both ends of the width direction D2 and a plurality of second concavities 72f located closer to a center side of the housing 72 in the width direction D2 than the first concavities 72e. The first concavity 72e extends in the longitudinal direction D1 and is recessed in the vertical direction D3. The second concavity 72f has a linear portion 72g linearly extending along the longitudinal direction D1 and a plurality of recessed portions 72h recessed from the linear portion 72g in the width direction D2. The plate-shaped portion 71e of the heat dissipation component 70 enters the linear portion 72g, and the protrusion 71f of the heat dissipation component 70 enters the recessed portion 72h. Then, the uneven surface 71 of the heat dissipation component 70 and the uneven surface 72b of the housing 72 are arranged so that each of the first wall portions 71c enters each of the first concavities 72e. A heat dissipation material G is interposed between the uneven surface 71 and the uneven surface 72b. For example, the plate-shaped portion 71e of the second wall portion 71d has a plane (first heat conduction surface) perpendicular to the upper surface (first surface) 13b of the circuit board 13 and parallel to the longitudinal direction D1 (first direction), and the linear portion 72g of the second concavity 72f has a plane (second heat conduction surface) facing the plane while being spaced apart from the plane. A heat dissipation material G is filled between the plate-shaped portion 71e and the linear portion 72g. Further, the protrusion 71f of the second wall portion 71d has a plane (third heat conduction surface) perpendicular to the upper surface (first surface) 13b of the circuit board 13 and parallel to the longitudinal direction D1 (first direction), and the recessed portion 72h of the second concavity 72f has a plane (fourth heat conduction surface) facing the plane while being spaced apart from the plane. A heat dissipation material G is filled between the protrusion 71f and the recessed portion 72h.

As described above, in the optical transceiver 1B according to another modification, a shape of the uneven surface 71 of the heat dissipation component 70 and a shape of the uneven surface 72b of the housing 72 are different from those of the optical transceiver 1A described above. In the optical transceiver 1B, the heat dissipation component 70 has portions (for example, the first wall portions 71c and the plate-shaped portions 71e) extending in the longitudinal direction D1 and portions (for example, the protrusions 71f) extending in the width direction D2. Since the housing 72 has portions (for example, the first concavities 72e, the linear portions 72g, and the recessed portions 72h) that these portions enter, surface areas of the uneven surfaces 71 and 72b can be increased. The plate-shaped portion 71e and the linear portion 72g have the planes facing each other while being spaced apart from each other, respectively, as described above. An interval between the planes facing each other is maintained even though the circuit board 13 is inclined in the vertical direction D3, and a heat dissipation material G filled between the planes facing each other is deformable. Therefore, a heat conduction path is secured between the plate-shaped portion 71e and the linear portion 72g. In addition, the protrusion 71f and the recessed portion 72h have the planes facing each other while being spaced apart from each other, respectively, as described above. The heat dissipation material G is filled and a heat conduction path is formed, between the protrusion 71f and the recessed portion 72h. Therefore, more heat paths J can be secured, and heat dissipation property can thus be further improved.

Figure 15:
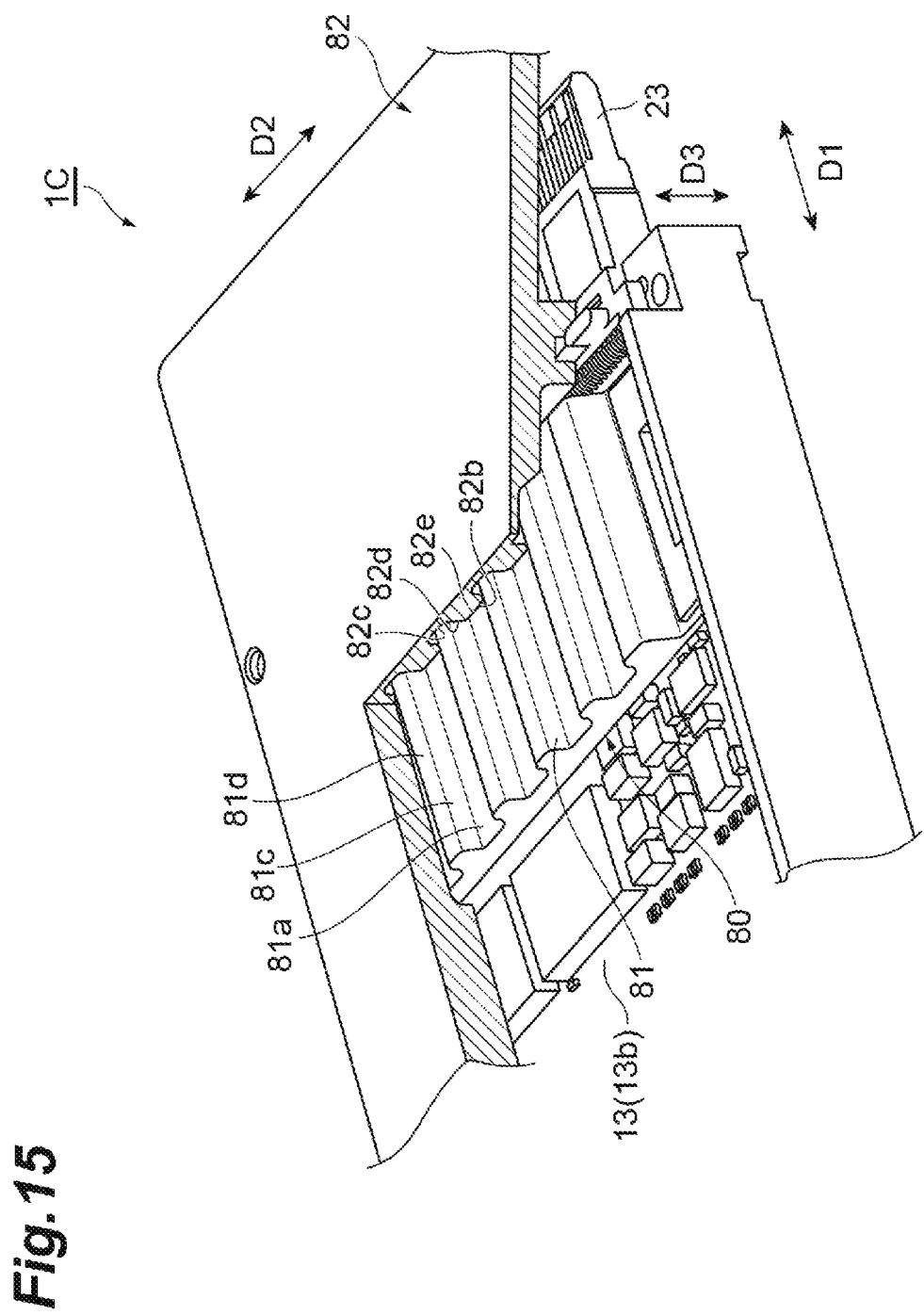
FIG. 15 is a partial cross-sectional perspective view illustrating an internal structure of an optical transceiver according to yet another modification.

Next, an optical transceiver 1C according to yet another modification will be described with reference to FIGS. 15 and 16. In the optical transceiver 1 described above, the uneven surface 51 of the heat dissipation component 50 and the uneven surface 7b of the housing 2 had the comb shape. On the other hand, in the optical transceiver 1C, an uneven surface 81 (first uneven surface) of a heat dissipation component 80 and an uneven surface 82b (second uneven surface) of a housing 82 have a shape in which a plurality of trapezoids are arranged. The uneven surface 81 of the heat dissipation component 80 has a bottom surface 81a, an inclined surface 81c (first heat conduction surface), and a top surface 81d. The uneven surface 81 is formed by arranging the bottom surface 81a, the inclined surface 81c, and the top surface 81d along the width direction D2. The uneven surface 82b of the housing 82 has a bottom surface 82c, an inclined surface 82d (second heat conduction surface), and a top surface 82e. The uneven surface 82b is formed by arranging the bottom surface 82c, the inclined surface 82d, and the top surface 82e along the width direction D2. The bottom surface 81a, the inclined surface 81c, and the top surface 81d of the heat dissipation component 80 face the top surface 82e, the inclined surface 82d, and the bottom surface 82c of the housing 82, respectively. A heat dissipation material G is interposed between the uneven surface 81 and the uneven surface 82b, as described above. The heat dissipation component 80 has the inclined surface 81c (first heat conduction surface) inclined in the width direction D2 with respect to the upper surface (first surface) 13b of the circuit board 13 and parallel to the longitudinal direction D1 (first direction), and the housing 82 has the inclined surface 82d (second heat conduction surface) facing the inclined surface 81c while being spaced apart from the inclined surface 81c. When the circuit board 13 is inclined in the vertical direction D3, an interval between the inclined surface 81c and the inclined surface 82d changes, but a heat dissipation material G filled between these inclined surfaces is deformable, and a heat conduction path is thus secured between the heat dissipation component 80 and the housing 82. As described above, even in the optical transceiver 1C including the heat dissipation component 80 in which the uneven surface 81 including the inclined surface 81c is formed and the housing 82 in which the uneven surface 82b including the inclined surface 82d is formed, heat paths J to the housing 82 via the heat dissipation component 80 are secured as described above, and a heat dissipation property can thus be improved.

Hereinabove, each of a plurality of examples including the embodiment and the modifications of the optical transceiver according to the present disclosure has been described. However, the optical transceiver according to the present disclosure is not limited to the examples described above. That is, it is easily recognized by those skilled in the art that the present disclosure can be modified and modified within the scope of the gist described in the claims. For example, in the embodiment described above, the heat dissipation component having the projections and the housing having the recesses have been exemplified. However, the optical transceiver according to the present disclosure may be an optical transceiver including a heat dissipation component having recesses and a housing having projections, and an aspect of an uneven surface of each of the heat dissipation component and the housing can be appropriately changed.

In the embodiment described above, the optical transceiver 1 including the veil 5 has been described. However, the optical transceiver according to the present disclosure may not include the veil 5, and may include, for example, a pull tab extending forward from the housing 2 instead of the veil 5. Further, a type of the optical transceiver and a configuration of each component of the optical transceiver are not limited to those of the embodiment and the modifications described above, and can be appropriately changed.

What is claimed is:

1. An optical transceiver configured to be inserted into an apparatus in a first direction, the optical transceiver comprising:
   a circuit board having a first side and a first edge, the first edge being provided at an end thereof in the first direction;
   a circuit component mounted on the first side of the circuit board;
   an electrical connector configured to hold the first edge of the circuit board;
   a thermal conductive member configured to be attached on the first side of the circuit board and touch the circuit component; the thermal conductive member having a first thermal conductive face inclined with respect to the first side of the circuit board and parallel to the first direction;
   a filling material having a thermal conductivity; and
   a housing having an inner face and an inner space defined by the inner face, the housing being configured to house the circuit board, the circuit component, the thermal conductive member, and the filling material, and configured to hold the electrical connector at an end thereof in the first direction, the housing having a second thermal conductive face facing the first thermal conductive face with a spacing;
   wherein the filling material adheres to the first thermal conductive face and the second thermal conductive face.

2. The optical transceiver according to claim 1, wherein the filling material is deformable with respect to stress applied by a relative displacement between the thermal conductive member and the housing.

3. The optical transceiver according to claim 2, wherein the filling material is a heat dissipation gel.

4. The optical transceiver according to claim 1,
wherein the thermal conductive member further has a third heat conduction surface perpendicular to the first surface and perpendicular to the first direction, and
the housing further has a fourth heat conduction surface formed on the inner surface and opposing the third heat conduction surface while being spaced apart from the third heat conduction surface.

5. The optical transceiver according to claim 1, wherein the thermal conductive member has a pillar extending in a normal direction of the first surface,
the first heat conduction surface is formed on a surface of the pillar,
the housing has a concavity that is formed in the inner surface and a part of the pillar enters, and
the second heat conduction surface is formed in the concavity.

\* \* \* \* \*